United States Patent
Nakayama et al.

(10) Patent No.: US 10,456,907 B2
(45) Date of Patent: Oct. 29, 2019

(54) ROBOT ARM AND ROBOT

(71) Applicant: FANUC CORPORATION, Yamanashi (JP)

(72) Inventors: Kazutaka Nakayama, Yamanashi (JP); Kenichirou Abe, Yamanashi (JP); Masahiro Morioka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 7 days.

(21) Appl. No.: 15/904,800

(22) Filed: Feb. 26, 2018

(65) Prior Publication Data
US 2018/0290293 A1    Oct. 11, 2018

(30) Foreign Application Priority Data

Apr. 10, 2017   (JP) ................. 2017-077796

(51) Int. Cl.
| | |
|---|---|
| *B25J 17/00* | (2006.01) |
| *B25J 17/02* | (2006.01) |
| *B25J 18/00* | (2006.01) |
| *B25J 9/00* | (2006.01) |
| *B25J 9/06* | (2006.01) |

(52) U.S. Cl.
CPC ........... *B25J 9/0024* (2013.01); *B25J 9/0012* (2013.01); *B25J 9/06* (2013.01); *B25J 18/00* (2013.01); *H01L 2924/0002* (2013.01)

(58) Field of Classification Search
CPC ... B25J 9/0012; B25J 18/00; B25J 9/00; B25J 9/0024
See application file for complete search history.

(56) References Cited

U.S. PATENT DOCUMENTS

| | | |
|---|---|---|
| 2014/0014219 A1 | 1/2014 | Takemura et al. |
| 2014/0338490 A1 | 11/2014 | Shinabe |
| (Continued) | | |

FOREIGN PATENT DOCUMENTS

| | | |
|---|---|---|
| CN | 103386692 A | 11/2013 |
| CN | 104175328 A | 12/2014 |
| (Continued) | | |

OTHER PUBLICATIONS

Japanese Decision to Grant a Patent dated Dec. 25, 2018, in connection with corresponding JP Application No. 2017-077796 (6 pgs., including machine-generated English translation).

(Continued)

*Primary Examiner* — Jake Cook
(74) *Attorney, Agent, or Firm* — Maier & Maier, PLLC

(57) ABSTRACT

Provided is a robot arm that is provided with mounting interface portions at both ends of a long resin arm body. Each of the mounting interface portions is provided with: a connecting section that is formed of resin and that is connected to the arm body; and a metal member that is embedded in the resin, which forms the connecting section, and that forms a mounting surface. The metal member is provided with a through-hole that penetrates therethrough in the plate-thickness direction and through which a mounting screw passes, and is embedded in the resin while exposing the mounting surface and a seating surface, for the mounting screw, around the through-hole, the seating surface being located at the opposite side from the mounting surface.

11 Claims, 8 Drawing Sheets

(56) References Cited

U.S. PATENT DOCUMENTS

2015/0040713 A1 2/2015 Hirano
2018/0169760 A1* 6/2018 Negishi .................. B33Y 80/00

FOREIGN PATENT DOCUMENTS

| | | | |
|---|---|---|---|
| EP | 2 808 132 A1 | 12/2014 |
| EP | 2835226 A1 | 2/2015 |
| JP | S60-118487 A | 6/1985 |
| JP | S60-221285 A | 11/1985 |
| JP | S63-174505 A | 7/1988 |
| JP | H06-079683 A | 3/1994 |
| JP | H06-66988 U | 9/1994 |
| JP | H08-057791 A | 3/1996 |
| JP | H08-218820 A | 8/1996 |
| JP | 2003-326491 A | 11/2003 |
| JP | 2009-190149 A | 8/2009 |
| JP | 2009-195998 A | 9/2009 |
| JP | 2010-149166 A | 7/2010 |
| JP | 2012-161886 A | 8/2012 |
| JP | 2013-018058 A | 1/2013 |
| JP | 2015-033750 A | 2/2015 |
| JP | 2018-167338 A | 11/2018 |

OTHER PUBLICATIONS

Japanese Memorandum of Decision to Grant a Patent, date of drafting is Dec. 18, 2018, in connection with corresponding JP Application No. 2017-077796 (2 pgs., including machine-generated English translation).

Japanese Search Report by Registered Searching Organization dated Dec. 4, 2018, in connection with corresponding JP Application No. 2017-077796 (18 pgs., including machine-generated English translation).

Chinese Office Action dated Mar. 12, 2019, in connection with corresponding CN Application No. 201810266553.X (9 pgs., including English translation).

* cited by examiner

ROBOT ARM AND ROBOT

CROSS-REFERENCE TO RELATED APPLICATIONS

This application is based on Japanese Patent Application No. 2017-077796, the contents of which are incorporated herein by reference.

FIELD

The present invention relates to a robot arm and a robot.

BACKGROUND

In general, industrial robot arms are made of metal, such as aluminum alloy, in order to maintain strength while achieving a weight reduction (for example, Japanese Unexamined Patent Application, Publication No. 2013-018058).

SUMMARY OF INVENTION

An object of the present invention is to provide a robot arm and a robot that achieve a weight reduction while maintaining strength and that can be manufactured at reduced cost.

According to one aspect, the present invention provides a robot arm including mounting interface portions at both ends of a long resin arm body, wherein each of the mounting interface portions is provided with: a connecting section that is formed of resin and that is connected to the arm body; and a metal member that is embedded in the resin that forms the connecting section, and that forms a mounting surface; and the metal member is provided with a through-hole that penetrates therethrough in the plate-thickness direction and through which a mounting screw passes, and is embedded in the resin while exposing the mounting surface and a seating surface, for the mounting screw, around the through-hole, the seating surface being located at the opposite side from the mounting surface.

Although not shown in the figures, the above-described metal member may be a plurality of pipe-shaped metal members that are circumferentially arranged.

In the above-described aspect, the metal member may be a flat-plate member having a plurality of the through-holes.

In the above-described aspect, the arm body may be formed into a hollow pipe shape having an inner hole; the connecting section may be formed to be hollow having a central hole into which the inner hole opens; and the metal member may be disposed at a position so as to surround the central hole.

In the above-described aspect, in the mounting interface portion, the mounting surface of the metal member may be disposed parallel to the longitudinal axis of the arm body.

In the above-described aspect, the mounting surfaces of the two mounting interface portions may be disposed in the same plane or disposed parallel to each other.

In the above-described aspect, the connecting section may be provided with an opening that makes the space inside the connecting section open to the outside at the opposite side from the central hole.

The above-described aspect may further include a lid member that openably closes the opening.

In the above-described aspect, the metal member may be embedded, through insert molding, in the resin that forms the connecting section.

In the above-described aspect, the mounting surface of the metal member may be disposed so as to protrude from the resin that forms the connecting section.

In the above-described aspect, a plurality of the through-holes may be provided in the mounting interface portion at intervals in the circumferential direction; and at least one of the through-holes disposed close to the arm body is closed by the resin that forms the connecting section, at the opposite side from the mounting surface.

According to another aspect, the present invention provides a robot including any of the above-described robot arms.

DETAILED DESCRIPTION OF THE FIGURES

Figure 1:
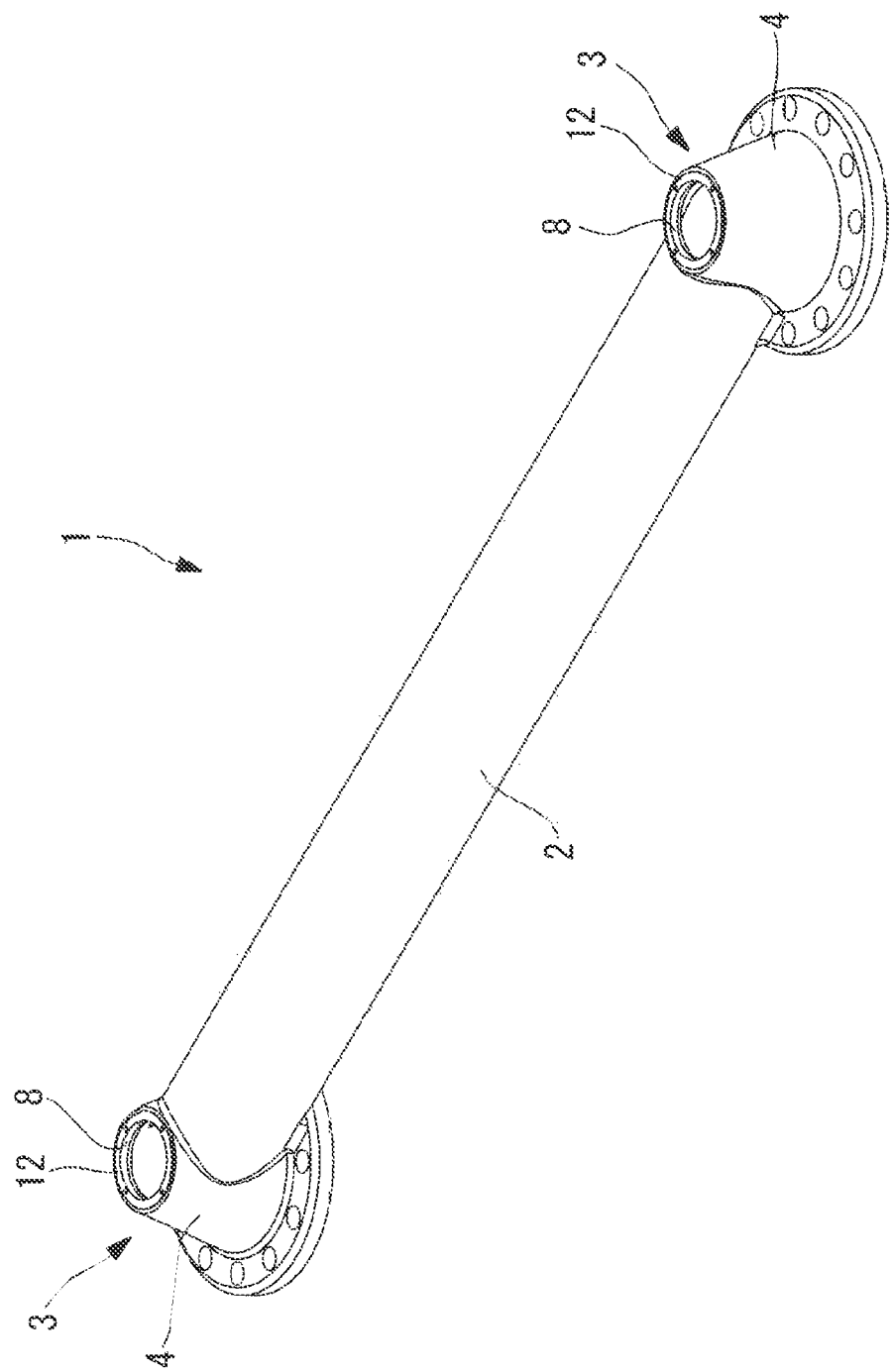
FIG. 1 is a perspective view showing a robot arm according to one embodiment of the present invention.

A robot arm 1 and a robot 100 according to one embodiment of the present invention will be described below with reference to the drawings.

As shown in FIGS. 1 to 5, the robot arm 1 of this embodiment is provided with: a cylindrical, pipe-shaped arm body 2; and two mounting interface portions 3, respectively provided at the two ends of the arm body 2 in the longitudinal-axis direction.

The arm body 2 is formed of resin.

Each of the mounting interface portions 3 is provided with: a connecting section 4 that is formed of resin and that is connected to the arm body 2; and a flat metal plate (metal member) 5 that is embedded in the resin that forms the connecting section 4. The metal plate 5 is embedded in the resin that forms the connecting section 4, through insert molding, for example.

Figure 2:
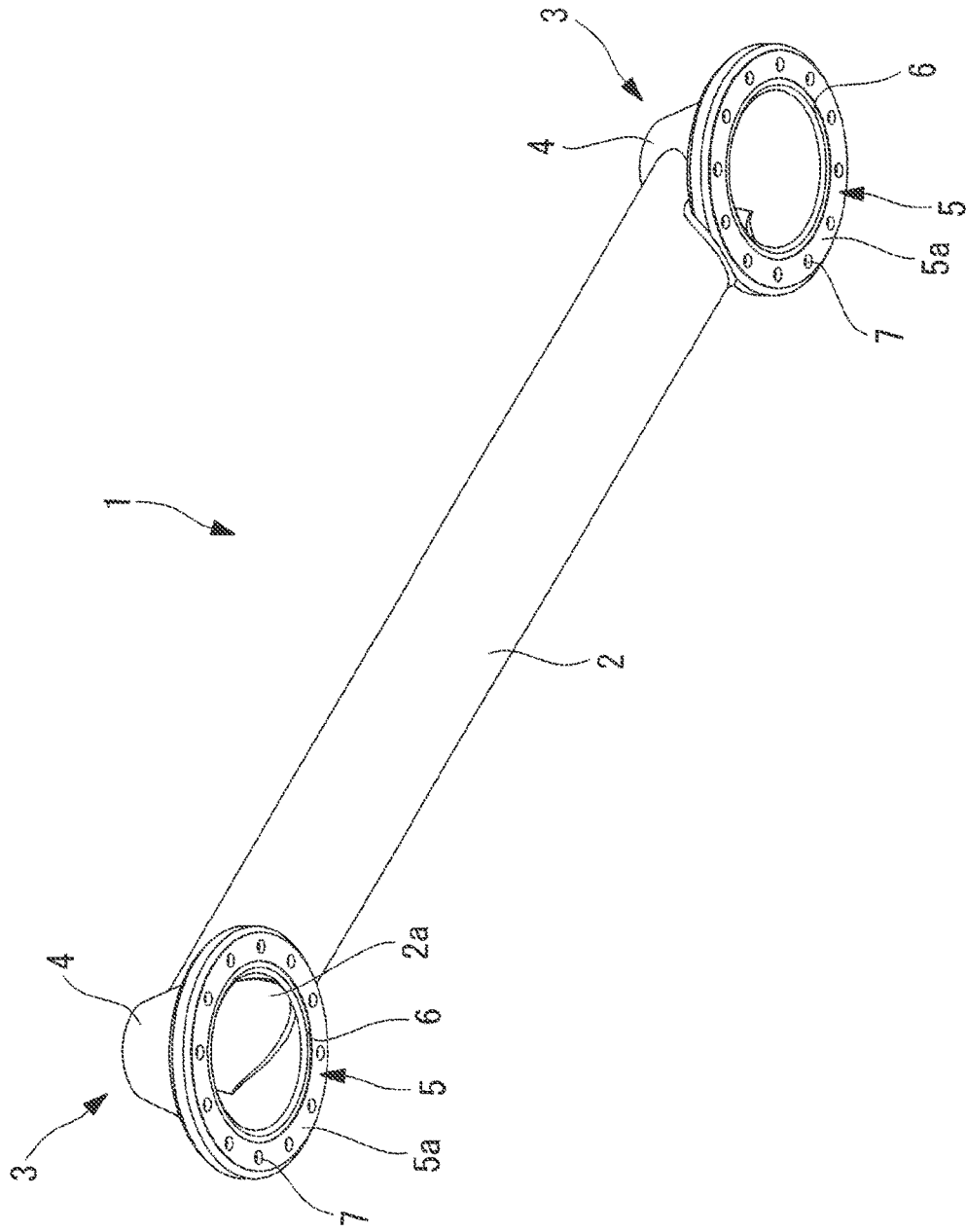
FIG. 2 is a perspective view of the robot arm shown in FIG. 1, viewed from a mounting-surface side.
Figure 3:
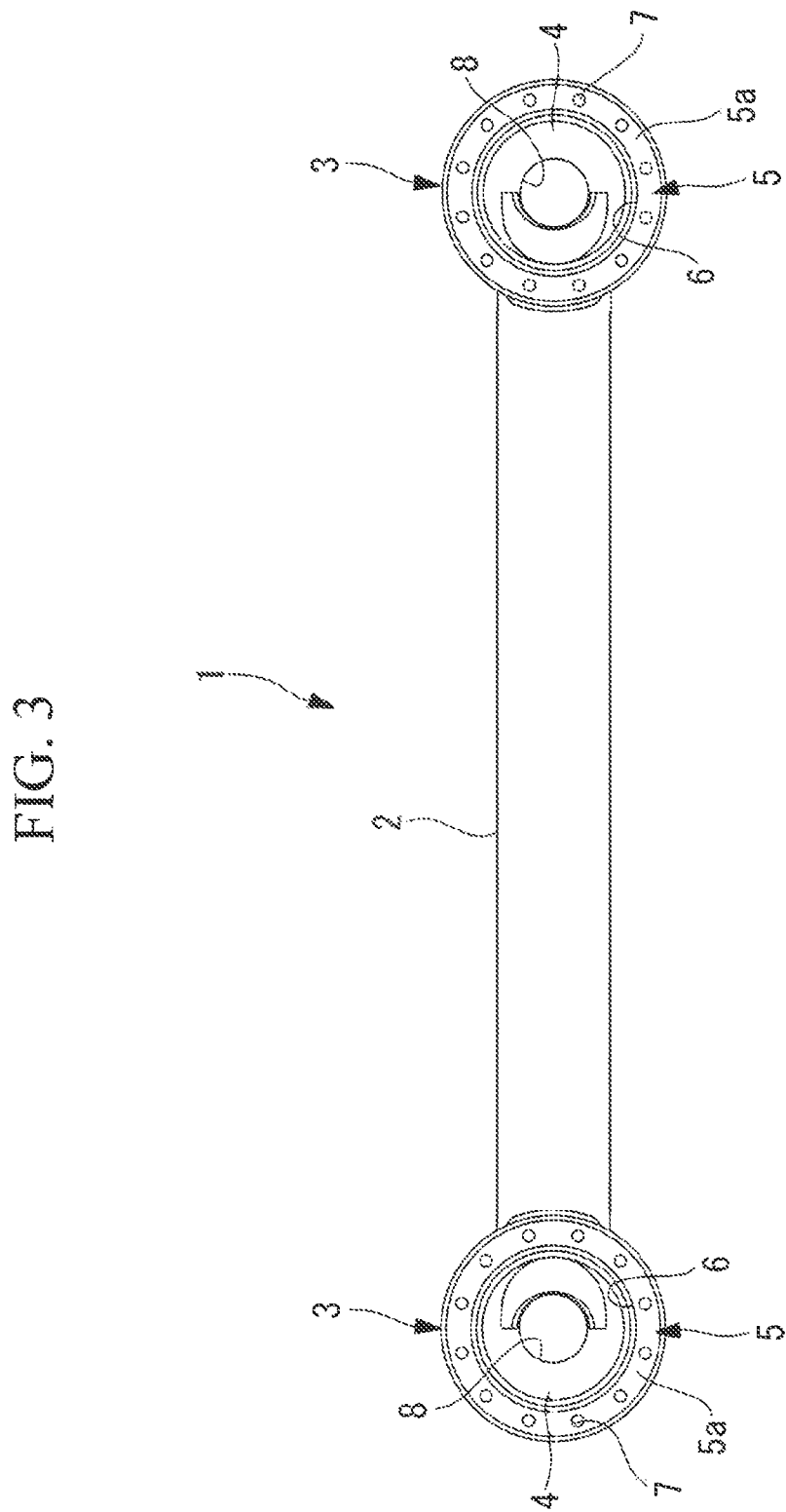
FIG. 3 is a view of the robot arm shown in FIG. 1, viewed from a mounting-surface side.
Figure 4:
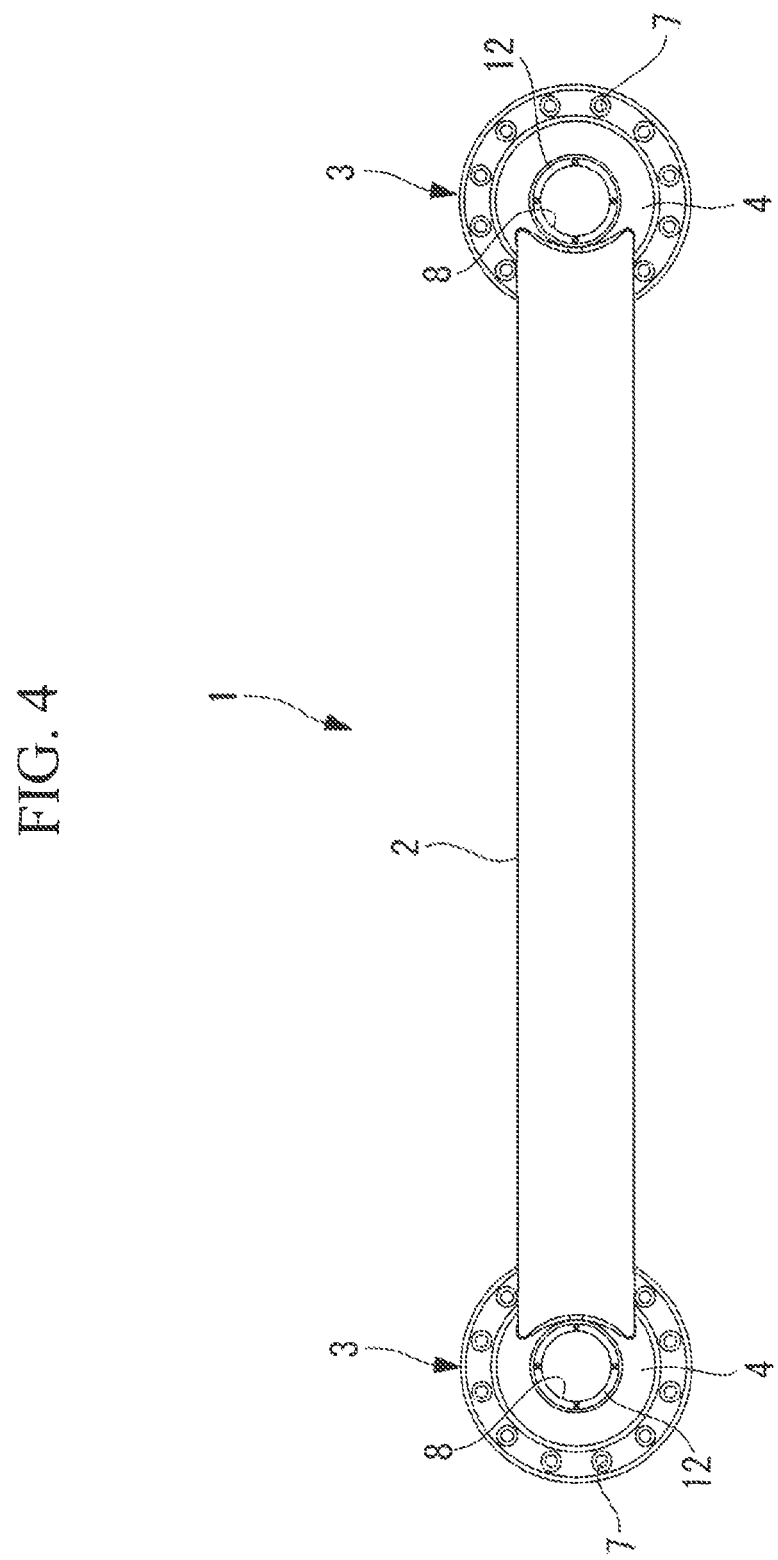
FIG. 4 is a plane view of the robot arm shown in FIG. 1.
Figure 5:
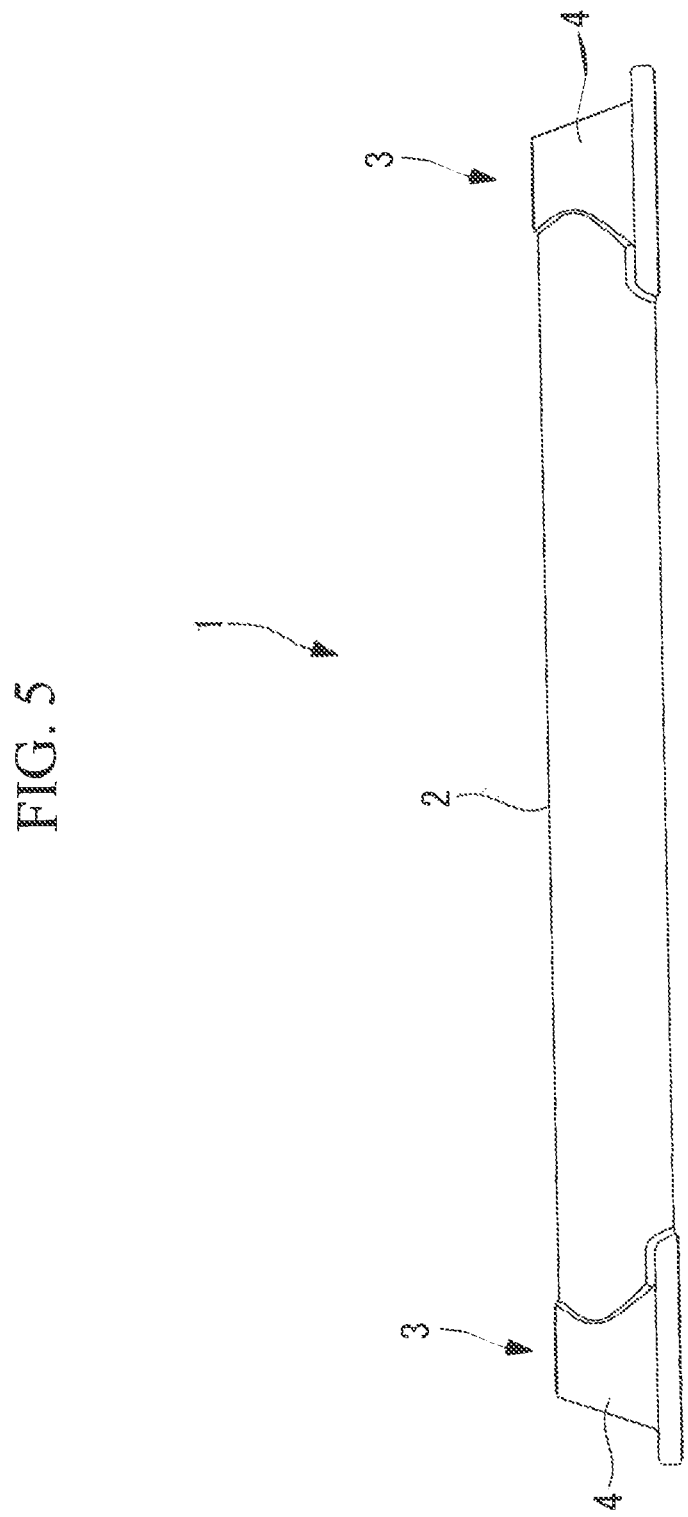
FIG. 5 is a side view of the robot arm shown in FIG. 1.

As shown in FIGS. 2 and 3, the metal plate 5 is formed into a ring-shaped plate having a central hole 6. The metal plate 5 is provided with a plurality of through-holes 7 that penetrate therethrough in the plate-thickness direction, at intervals in the circumferential direction.

The respective connecting sections 4 are formed to be hollow, and an inner hole 2a of the arm body 2 is made to open into the central holes 6 of the two metal plates 5.

One surface of the metal plate 5 in the plate-thickness direction serves as a mounting surface 5a, and the mounting surface 5a is entirely exposed.

Figure 6:
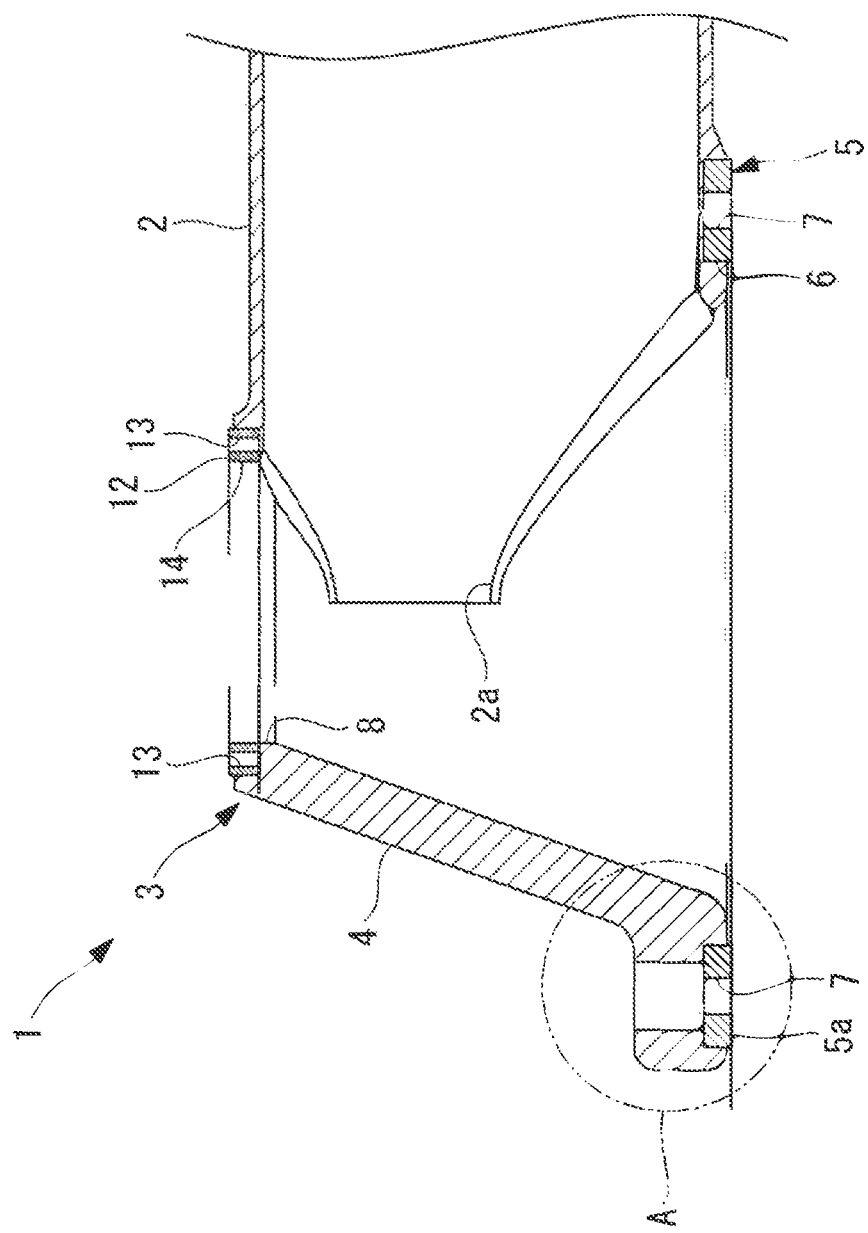
FIG. 6 is a partially enlarged transverse sectional view of a mounting interface portion of the robot arm shown in FIG. 1.

The other surface of the metal plate 5 in the plate-thickness direction is covered with the resin that forms the connecting section 4, as shown in FIG. 6, in a state in which the surroundings of some of the through-holes 7 are partially exposed. The surface of the metal plate 5 that is exposed around each of those through-holes 7 is slightly larger than the outer diameter of the head of a mounting screw to be inserted into the through-hole 7 so as to function as a seating surface for the mounting screw.

The through-holes 7 that are arranged at positions overlapping with the arm body 2 are covered with the resin that forms the arm body 2 so as to close those through-holes 7, without exposing the corresponding section of the metal plate 5 serving as the seating surface. With this configuration, when positioning pins are inserted, the positioning pins can be prevented from being removed through the operation of the robot 100, etc.

The mounting surface 5*a* of the metal plate 5 is disposed at a position protruding from the resin that forms the connecting section 4. Then, the mounting surfaces 5*a* of the metal plates 5 on the two connecting sections 4 are disposed in the same plane.

The connecting sections 4 are each provided with an opening 8 that makes the space inside the connecting section 4 open to the outside at the opposite side from the central hole 6 in the metal plate 5. The opening 8 can be closed by a lid member 10, to be described later.

In order to manufacture the thus-configured robot arm 1 of this embodiment, in a state in which the surfaces of the two metal plates 5 at one side, which serve as the mounting surfaces 5*a* of the two metal plates 5 precisely manufactured through machining or the like, are positioned by using a jig or the like so as to be disposed in the same plane, the metal plates 5 are subjected to insert molding with the resin that forms the arm body 2 and the connecting sections 4, thereby manufacturing the robot arm 1 having the two mounting interface portions 3 at the respective ends of the arm body 2.

Alternatively, the two mounting interface portions 3 that are obtained by subjecting the metal plates 5 to insert molding with respect to the connecting sections 4 are fixed to the respective ends of the arm body 2 in a state in which the mounting surfaces 5*a* of the metal plates 5 are positioned so as to be disposed in the same plane, thereby manufacturing the robot arm 1.

According to the thus-manufactured robot arm 1 of this embodiment, because almost the whole of the robot arm 1 is formed of resin, it is possible to achieve a significant weight reduction compared with a case in which the robot arm 1 is formed of metal, such as aluminum alloy.

Because the metal plates 5, which have been precisely formed, are subjected to insert molding for manufacturing, the mounting surfaces 5*a* of the two metal plates 5 can be precisely disposed without being machined. Accordingly, machining becomes unnecessary, thus making it possible to reduce the manufacturing cost.

In particular, because the mounting surfaces 5*a* of the metal plates 5 are made to protrude from the resin that forms the connecting section 4, there is an advantage in that the resin does not become an obstacle when the robot arm 1 is mounted to a reducer output shaft 110.

Figure 8:
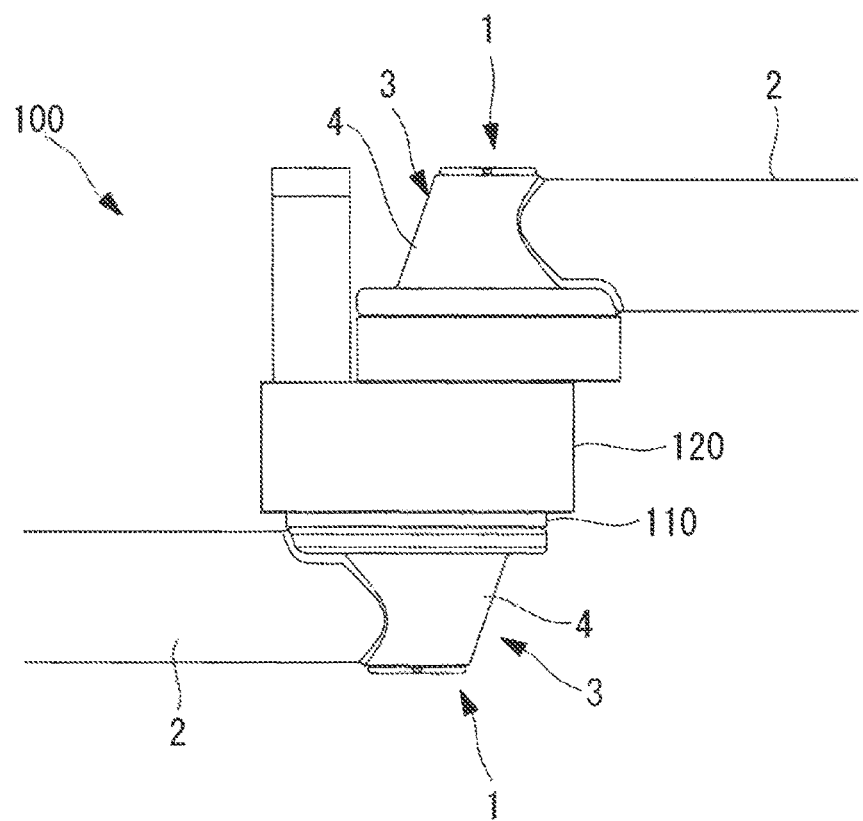
FIG. 8 is a front view showing a joint shaft portion of a robot when the robot arm shown in FIG. 1 is mounted to a reducer.
Figure 9:
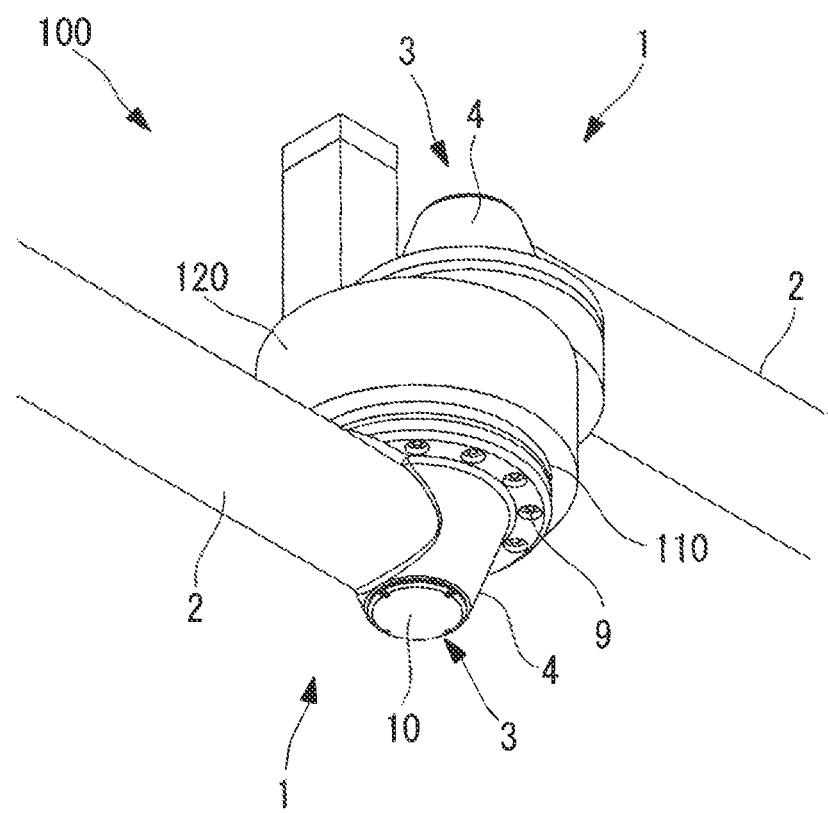
FIG. 9 is a perspective view showing the joint shaft portion shown in FIG. 8.

Then, as shown in FIGS. 8 and 9, the robot arm 1 is fixed to the reducer output shaft 110 etc. of the robot 100, thereby making it possible to easily constitute a joint shaft of the robot 100.

In this case, mounting screws 9 are made to pass through the through-holes 7, which are provided in the metal plate 5, and are fastened into screw holes in the reducer output shaft 110, thereby making it possible to press the heads of the mounting screws 9 against the seating surface, which is the surface located at the opposite side of the metal plate 5 from the mounting surface 5*a*.

Specifically, if there is resin between the heads of the mounting screws 9 and the reducer output shaft 110, sufficient fastening cannot be implemented, thus causing a fear that the mounting screws 9 will become loose after the robot 100 is repeatedly operated; however, in this embodiment, because only the metal plate 5 is disposed between the heads of the mounting screws 9 and the reducer output shaft 110, there is an advantage in that it is possible to implement fastening with sufficient fastening strength and to reliably prevent the mounting screws 9 from becoming loose.

Figure 7:
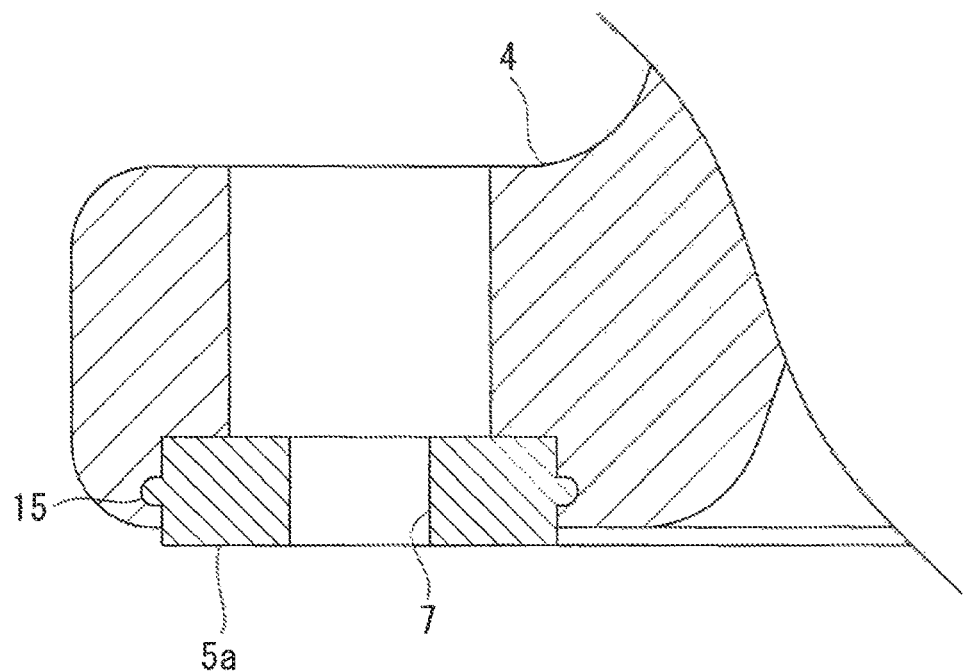
FIG. 7 is an enlarged transverse sectional view of a portion A shown in FIG. 6.

However, it is necessary to take great care so as to prevent the metal plate 5 itself from becoming detached from the resin member of the connecting section 4 due to the load. In view of this, as shown in FIG. 7, it is preferred to employ a structure in which a convex portion 15 that protrudes radially at a position, on the side surface of the metal plate 5, away from the mounting surface 5*a* in the thickness direction. By doing so, because the metal plate 5 is formed into a concavo-convex shape in vertical section in the arm longitudinal direction, the convex portion 15 is held by the connecting section 4, thus making it possible to prevent the metal plate 5 from being removed unless the resin member of the connecting section 4 is destroyed. Although the structure in which the convex portion 15 is provided on the metal plate 5 is shown as an example, instead of this, it is also possible to provide, on the side surface of the metal plate 5, a concave portion that is radially recessed at a middle position in the thickness direction.

According to the robot arm 1 of this embodiment, because the arm body 2 is formed into a hollow pipe shape having the inner hole 2*a*, the metal plates 5 are each formed into a ring-shaped plate having the central hole 6, and the connecting sections 4 are each formed to be hollow so as to make the inner hole 2*a* open into the central hole 6, one space that continues from the mounting surface 5*a* on one of the mounting interface portions 3 to the mounting surface 5*a* on the other mounting interface portion 3 through the inner hole 2*a* of the arm body 2 is formed inside the robot arm 1. Accordingly, there is an advantage in that it is possible to pass a wire-shaped body, such as a cable, through the space and to wire the wire-shaped body without causing it to be exposed to the outside.

Because the opening 8, which makes the space in the connecting section 4 open to the outside at the opposite side from the central hole 6 in the metal plate 5, is provided, there is an advantage in that it is possible to access the internal space of the robot arm 1 via the opening 8 in a state in which the central hole 6 in the metal plate 5 is closed by fixing the mounting surface 5*a* to a mounting-target body, such as an actuator 120, thus making it possible to easily perform the attaching work, the wiring work, etc. for the wire-shaped body.

As shown in FIG. 9, in order to fix the lid member 10, which closes the opening 8, to the connecting section 4 by means of screws, a metal plate 12 that is formed into a ring-shaped plate having a central hole 14 communicating with the opening 8, is embedded in the connecting section 4 through insert molding, and screw holes 13 are provided in the metal plate 12, thereby making it possible to fix the lid member 10 so as not to become loose. By firmly fastening the lid member 10, an increased strength of the robot arm 1 can be achieved.

Although the through-holes 7 around which the surface of the metal plate 5 serving as the seating surface is exposed can be used to fix the robot arm 1 to the reducer output shaft 110 or the like by using the mounting screws 9, as described above, the through-holes 7 that overlap with the arm body 2, thus being closed by the resin, can also be used as pinholes into which positioning pins for positioning between the robot arm 1 and the reducer output shaft 110 in the circumferential direction are fitted.

Although a robot arm that is manufactured in a state in which the mounting surfaces 5a of the two metal plates 5 have been positioned so as to be disposed in the same plane is shown as an example of the robot arm 1 of this embodiment, instead of this, it is also possible to manufacture the robot arm 1 in a state in which the mounting surfaces 5a of the two metal plates 5 have been positioned so as to be disposed to be parallel to each other.

In this embodiment, although the metal plate 5, which is a ring-shaped plate member having the central hole 6 and the plurality of through-holes 7 around the central hole 6, is shown as an example metal member, instead of this, a plurality of washer-like metal members each having a single through-hole can be disposed around the central hole 6 and can be embedded in the resin that forms the connecting section 4.

As a result, the following aspect is derived from the above-described embodiment.

According to one aspect, the present invention provides a robot arm including mounting interface portions at both ends of a long resin arm body, wherein each of the mounting interface portions is provided with: a connecting section that is formed of resin and that is connected to the arm body; and a metal member that is embedded in the resin that forms the connecting section, and that forms a mounting surface; and the metal member is provided with a through-hole that penetrates therethrough in the plate-thickness direction and through which a mounting screw passes, and is embedded in the resin while exposing the mounting surface and a seating surface, for the mounting screw, around the through-hole, the seating surface being located at the opposite side from the mounting surface.

According to this aspect, because the arm body and the connecting sections of the mounting interface portions, which constitute the robot arm, are formed of resin, it is possible to achieve a significant weight reduction, compared with a conventional robot arm that uses a metal material. In this case, the connecting sections are molded with resin in a state in which the metal members on the mounting interface portions at the ends of the arm body have been mutually precisely positioned in resin molding dies, thereby making it unnecessary to machine the assembled robot arm if the metal members are precisely machined in advance and making it possible to reduce the manufacturing cost.

When the robot arm is fixed to a mounting-target body, such as an actuator, by the mounting screws, which are made to pass through the through-holes in the metal members provided on the mounting interface portions, because the surfaces of the metal members are exposed as the seating surfaces for the mounting screws, it is possible to fasten the mounting screws without resin intervening between the heads of the mounting screws and the mounting-target body, and to more reliably fix the robot arm by preventing loosening etc. of the mounting screws caused by a repeated stress action.

Although not shown in the figures, the above-described metal member may be a plurality of pipe-shaped metal members that are circumferentially arranged.

In the above-described aspect, the metal member may be a flat-plate member having a plurality of the through-holes.

In the above-described aspect, the arm body may be formed into a hollow pipe shape having an inner hole; the connecting section may be formed to be hollow having a central hole into which the inner hole opens; and the metal member may be disposed at a position so as to surround the central hole.

By doing so, one space that continues from the mounting surface on one of the mounting interface portions to the mounting surface on the other mounting interface portion through the inner hole of the arm body is formed in the robot arm. Thus, it is possible to pass a wire-shaped body, such as a cable, through this space and to wire the wire-shaped body without causing it to be exposed to the outside.

In the above-described aspect, in the mounting interface portion, the mounting surface of the metal member may be disposed parallel to the longitudinal axis of the arm body.

By doing so, the robot arm can easily be fixed to the actuator, which is driven rotationally about an axis perpendicular to the longitudinal axis of the arm body, by means of the metal member.

In the above-described aspect, the mounting surfaces of the two mounting interface portions may be disposed in the same plane or disposed parallel to each other.

By doing so, it is possible to precisely manufacture the mounting surfaces of the two mounting interface portions and to use the robot arm as a typical robot arm capable of swinging around two parallel axes.

In the above-described aspect, the connecting section may be provided with an opening that makes the space inside the connecting section open to the outside at the opposite side from the central hole.

By doing so, it is possible to access the internal space of the robot arm via the opening in a state in which the central hole surrounded by the metal member is closed by fixing the mounting surface to a mounting-target body, such as an actuator, thus making it possible to easily perform wiring work etc. for the wire-shaped body.

The above-described aspect may further include a lid member that openably closes the opening.

By doing so, the opening is opened to perform wiring work etc. for the wire-shaped body and is then closed by the lid member, thereby making it possible to close the internal space of the robot arm with respect to the outside.

In the above-described aspect, the metal member may be embedded, through insert molding, in the resin that forms the connecting section.

By doing so, the metal member can be easily and precisely embedded in the resin that forms the connecting section.

In the above-described aspect, the mounting surface of the metal member may be disposed so as to protrude from the resin that forms the connecting section.

By doing so, it is possible to fix the robot arm to a mounting-target body, such as an actuator, by means of the mounting surface of the metal member, without machining the surrounding resin.

In the above-described aspect, a plurality of the through-holes may be provided in the mounting interface portion at intervals in the circumferential direction; and at least one of the through-holes disposed close to the arm body is closed by the resin that forms the connecting section, at the opposite side from the mounting surface.

By doing so, although the mounting screw cannot be inserted into the through-hole that is located at a section of the metal member overlapping with the arm body because the arm body becomes an obstacle, the through-hole that is open to the mounting surface can be used as a pinhole for positioning between the arm body and a mounting-target body, such as an actuator. The through-holes in the metal member are circumferentially arranged at regular intervals and are formed into the same shape in the front and back sides, thereby making it possible to have a structure with which it is not necessary to pay much attention to management of the front and back sides of the metal member with respect to the connecting section and management of the phase in the rotational direction.

According to another aspect, the present invention provides a robot including any of the above-described robot arms.

REFERENCE SIGNS LIST 1 robot arm
2 arm body
2a inner hole
3 mounting interface portion
4 connecting section
5 metal plate (metal member)
5a mounting surface
6 central hole
7 through-hole
8 opening
9 mounting screw
10 lid member
100 robot

The invention claimed is:

1. A robot arm comprising mounting interface portions at both ends of a long resin arm body,
wherein each of the mounting interface portions is provided with: a connecting section that is formed of resin and that is connected to the arm body; and a metal member that is formed of a flat plate-like member or a washer-like member and that is embedded in the resin that forms the connecting section, and that forms a mounting surface; and
the metal member is provided with at least one through-hole that penetrates therethrough in a thickness direction of the flat plate-like member or the washer-like member and through which a mounting screw passes and is embedded in the resin while exposing the mounting surface and a seating surface, for the mounting screw, around the at least one through-hole, the seating surface being located at an opposite side from the mounting surface.

2. A robot arm according to claim 1, wherein the metal member has a plurality of the through-holes.

3. A robot arm according to claim 1,
wherein the arm body is formed into a hollow pipe shape having an inner hole;
the connecting section is formed to be hollow having a central hole into which the inner hole opens; and
the metal member is disposed at a position so as to surround the central hole.

4. A robot arm according to claim 1, wherein, in each of the mounting interface portions, the mounting surface of the metal member is disposed parallel to the longitudinal axis of the arm body.

5. A robot arm according to claim 1, wherein the mounting surfaces of each of the mounting interface portions are disposed in a same plane or disposed parallel to each other.

6. A robot arm according to claim 3, wherein the connecting section is provided with an opening that makes the space inside the connecting section open to the outside at an opposite side from the central hole.

7. A robot arm according to claim 6, further comprising a lid member that removably closes the opening.

8. A robot arm according to claim 1, wherein the metal member is embedded, through insert molding, in the resin that forms the connecting section.

9. A robot arm according to claim 1, wherein the mounting surface of the metal member is disposed so as to protrude from the resin that forms the connecting section.

10. A robot arm according to claim 1,
wherein a plurality of the through-holes are provided in each of the mounting interface portions at intervals in the circumferential direction; and
at least one of the through-holes disposed close to the arm body is closed by the resin that forms the connecting section, at the opposite side from the mounting surface.

11. A robot comprising a robot arm according to claim 1.

* * * * *